(12) United States Patent
Dunn et al.

(10) Patent No.: US 12,250,781 B2
(45) Date of Patent: *Mar. 11, 2025

(54) DISPLAY ASSEMBLY WITH UNOBSTRUCTED ZONE

(71) Applicant: Manufacturing Resources International, Inc., Alpharetta, GA (US)

(72) Inventors: William Dunn, Alpharetta, GA (US); Mike Brown, Cumming, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/643,091

(22) Filed: Apr. 23, 2024

(65) Prior Publication Data
US 2024/0276662 A1 Aug. 15, 2024

Related U.S. Application Data

(63) Continuation of application No. 17/976,054, filed on Oct. 28, 2022, now Pat. No. 11,997,808, which is a
(Continued)

(51) Int. Cl.
*H02G 11/02* (2006.01)
*B60L 53/18* (2019.01)
(Continued)

(52) U.S. Cl.
CPC ............ *H05K 5/0234* (2013.01); *B60L 53/18* (2019.02); *B60L 53/305* (2019.02); *G09F 9/35* (2013.01);
(Continued)

(58) Field of Classification Search
None
See application file for complete search history.

(56) References Cited

U.S. PATENT DOCUMENTS

| 2,029,221 A | 1/1936 | Burgess et al. |
| 2,678,860 A | 5/1954 | Peterson |

(Continued)

FOREIGN PATENT DOCUMENTS

| AU | 2015229457 B2 | 3/2019 |
| AU | 2019315350 B2 | 9/2022 |

(Continued)

OTHER PUBLICATIONS

The Free Dictionary, Bolt—Definition of bolt by The Free Dictionary, Jun. 15, 2016, 1 Page.
(Continued)

*Primary Examiner* — Xanthia C Relford
*Assistant Examiner* — Xanthia C Cunningham
(74) *Attorney, Agent, or Firm* — Standley Law Group LLP; Jeffrey S. Standley; Adam J. Smith

(57) ABSTRACT

A display assembly includes a framework, an electronic display subassembly connected to the framework at an elevated position, and an open, unobstructed, pass-through area located below the electronic display subassembly and within the framework. The pass-through area may assist with sightlines through the display assembly, by way of example. Wiring may be routed from a base along or through upward extending members of the framework.

20 Claims, 9 Drawing Sheets

Related U.S. Application Data continuation-in-part of application No. 17/900,382, filed on Aug. 31, 2022, now Pat. No. 12,039,894.

(51) Int. Cl.
  *B60L 53/30* (2019.01)
  *G09F 9/35* (2006.01)
  *H02J 7/00* (2006.01)
  *H05K 5/02* (2006.01)

(52) U.S. Cl.
  CPC ............ *H02G 11/02* (2013.01); *H02J 7/0042* (2013.01); *H05K 5/0213* (2013.01); *H05K 5/0226* (2013.01)

(56) References Cited

U.S. PATENT DOCUMENTS

| | | |
|---|---|---|
| D195,829 S | 8/1963 | Paster |
| D196,039 S | 8/1963 | Hollaender |
| D204,056 S | 3/1966 | Barfley et al. |
| 3,587,186 A | 6/1971 | Lane |
| D222,989 S | 2/1972 | Cohen |
| 3,757,218 A | 9/1973 | Oliverio et al. |
| 3,762,109 A | 10/1973 | Cohen |
| 3,984,931 A | 10/1976 | Belokin, Jr. |
| D250,836 S | 1/1979 | Lahaie |
| D252,215 S | 6/1979 | Leuthesser |
| 4,169,327 A | 10/1979 | Stilling |
| 4,187,058 A | 2/1980 | Fish |
| 4,267,657 A | 5/1981 | Kloke |
| 4,327,513 A | 5/1982 | de Gunzburg |
| D264,731 S | 6/1982 | Shuman |
| 4,452,000 A | 6/1984 | Gandy |
| 4,547,987 A | 10/1985 | Stilling |
| D285,810 S | 9/1986 | Glasener |
| D286,074 S | 10/1986 | Corte |
| D286,075 S | 10/1986 | Corte |
| 4,718,185 A | 1/1988 | Conlin et al. |
| 4,759,143 A | 7/1988 | Pomerleau |
| 4,792,881 A | 12/1988 | Wilson et al. |
| 4,817,317 A | 4/1989 | Kovalak, Jr. |
| 4,903,221 A | 2/1990 | Krenz |
| 4,903,423 A | 2/1990 | Hinca |
| D306,464 S | 3/1990 | Axtell |
| 4,905,390 A | 3/1990 | Stilling |
| D311,722 S | 10/1990 | Cheng |
| 5,025,355 A | 6/1991 | Harwood |
| 5,179,367 A | 1/1993 | Shimizu |
| D336,136 S | 6/1993 | Foster |
| 5,299,109 A | 3/1994 | Grondal |
| 5,306,156 A | 4/1994 | Gibbs et al. |
| D357,944 S | 5/1995 | Atwell et al. |
| 5,423,142 A | 6/1995 | Douglas et al. |
| D360,078 S | 7/1995 | Sarkisian et al. |
| 5,457,905 A | 10/1995 | Kaplan |
| 5,493,802 A | 2/1996 | Simson |
| D373,120 S | 8/1996 | Andre et al. |
| D375,980 S | 11/1996 | Current |
| D380,191 S | 6/1997 | White |
| 5,717,424 A | 2/1998 | Simson et al. |
| D393,008 S | 3/1998 | Hiraguchi et al. |
| 5,755,050 A | 5/1998 | Aiken |
| D395,677 S | 6/1998 | Gongora et al. |
| D398,653 S | 9/1998 | Hiraguchi et al. |
| 5,803,424 A | 9/1998 | Keehn et al. |
| D403,434 S | 12/1998 | Sander |
| D406,352 S | 3/1999 | Kleihues |
| D408,554 S | 4/1999 | Dinwoodie |
| D409,759 S | 5/1999 | Foster |
| D410,036 S | 5/1999 | Washington |
| 5,899,027 A | 5/1999 | St. Louis |
| D410,751 S | 6/1999 | Meier |
| D415,736 S | 10/1999 | Witte |
| 6,050,833 A | 4/2000 | Danzyger et al. |
| D436,630 S | 1/2001 | Gonsiorowski et al. |
| 6,172,869 B1 | 1/2001 | Hood, III et al. |
| D438,258 S | 2/2001 | Itoh et al. |
| 6,198,222 B1 | 3/2001 | Chang |
| 6,231,446 B1 | 5/2001 | Majima et al. |
| D446,821 S | 8/2001 | Decaux |
| D447,183 S | 8/2001 | Wilmotte |
| D450,776 S | 11/2001 | Albrecht |
| D453,194 S | 1/2002 | Gentelia et al. |
| D455,789 S | 4/2002 | Schlueter |
| 6,396,239 B1 | 5/2002 | Benn et al. |
| 6,405,463 B1 | 6/2002 | Roddy et al. |
| D461,785 S | 8/2002 | Wilmotte |
| 6,427,284 B1 | 8/2002 | Harrelson, II et al. |
| 6,469,752 B1 | 10/2002 | Ishikawa et al. |
| D467,561 S | 12/2002 | Kosciolek |
| 6,494,429 B2 | 12/2002 | Tajima |
| D472,223 S | 3/2003 | Wilmotte |
| 6,557,284 B2 | 5/2003 | Nolan |
| D479,659 S | 9/2003 | Fleckenstein et al. |
| D479,859 S | 9/2003 | Strunk et al. |
| 6,639,571 B2 | 10/2003 | Wang |
| D483,074 S | 12/2003 | Strunk et al. |
| D486,188 S | 2/2004 | Norcross et al. |
| D487,519 S | 3/2004 | Staubach et al. |
| 6,748,685 B2 | 6/2004 | Peel |
| 6,758,002 B1 | 7/2004 | Duguay |
| D493,842 S | 8/2004 | Norcross et al. |
| D500,143 S | 12/2004 | Moncho et al. |
| D501,889 S | 2/2005 | Harris et al. |
| D505,018 S | 5/2005 | Stravitz |
| D505,113 S | 5/2005 | Lam |
| D509,543 S | 9/2005 | Hillstrom et al. |
| 6,962,528 B2 | 11/2005 | Yokota |
| 6,976,330 B2 | 12/2005 | Milliken |
| 6,977,627 B1 | 12/2005 | Dalton |
| D514,913 S | 2/2006 | Dunn et al. |
| D530,432 S | 10/2006 | Gottesdiener |
| D530,686 S | 10/2006 | Reza |
| D535,034 S | 1/2007 | Gottesdiener |
| D542,849 S | 5/2007 | Hill et al. |
| 7,210,839 B2 | 5/2007 | Jung et al. |
| D544,848 S | 6/2007 | Marz et al. |
| 7,226,176 B1 | 6/2007 | Huang |
| D547,740 S | 7/2007 | Otani |
| 7,292,435 B2 | 11/2007 | She |
| D559,577 S | 1/2008 | Quinn |
| D560,668 S | 1/2008 | Pritchard et al. |
| D562,407 S | 2/2008 | Graziani |
| 7,339,782 B1 | 3/2008 | Landes et al. |
| D579,053 S | 10/2008 | Rubie et al. |
| D582,478 S | 12/2008 | Loerakker |
| D585,943 S | 2/2009 | Pymm et al. |
| D587,315 S | 2/2009 | Piantanida |
| D587,760 S | 3/2009 | Miranda et al. |
| D590,890 S | 4/2009 | King et al. |
| 7,513,830 B2 | 4/2009 | Hajder et al. |
| D592,705 S | 5/2009 | Giugiaro |
| D592,762 S | 5/2009 | King et al. |
| D593,213 S | 5/2009 | Grimshaw et al. |
| D595,645 S | 7/2009 | Beghelli |
| D595,678 S | 7/2009 | Dunn |
| 7,589,958 B2 | 9/2009 | Smith |
| 7,591,508 B2 | 9/2009 | Chang |
| 7,601,067 B2 | 10/2009 | Anderson |
| 7,609,506 B2 | 10/2009 | Aguirre |
| D603,973 S | 11/2009 | Jackson et al. |
| D608,775 S | 1/2010 | Leung |
| D610,536 S | 2/2010 | Brumels |
| 7,768,775 B2 | 8/2010 | Kim |
| D627,397 S | 11/2010 | Horn et al. |
| D628,968 S | 12/2010 | Desai et al. |
| D631,097 S | 1/2011 | Giugiaro |
| D635,614 S | 4/2011 | Yan |
| D637,594 S | 5/2011 | Carpenter, Jr. et al. |
| D639,800 S | 6/2011 | Magruder |
| 7,965,039 B2 | 6/2011 | Watanabe et al. |
| 7,985,139 B2 | 7/2011 | Lind et al. |
| 8,006,435 B2 | 8/2011 | DeBlonk et al. |
| 8,016,452 B2 | 9/2011 | Dunn |

(56) References Cited

U.S. PATENT DOCUMENTS

| | | | |
|---|---|---|---|
| D646,269 S | 10/2011 | Crick, Jr. et al. |
| D652,789 S | 1/2012 | Kawai et al. |
| D653,662 S | 2/2012 | Park et al. |
| D654,116 S | 2/2012 | McDougall et al. |
| 8,116,081 B2 | 2/2012 | Crick, Jr. |
| D657,421 S | 4/2012 | Yan |
| D657,422 S | 4/2012 | Yan |
| D659,259 S | 5/2012 | Duddy |
| D661,123 S | 6/2012 | Curbbun et al. |
| D661,124 S | 6/2012 | Curbbun et al. |
| D662,040 S | 6/2012 | Yang et al. |
| D662,329 S | 6/2012 | Arko et al. |
| D665,029 S | 8/2012 | Krapf et al. |
| D669,938 S | 10/2012 | Lard et al. |
| D671,885 S | 12/2012 | Steinau |
| 8,335,089 B2 | 12/2012 | Takahashi et al. |
| 8,418,387 B2 | 4/2013 | Swatt et al. |
| 8,537,302 B2 | 9/2013 | Dunn |
| D696,658 S | 12/2013 | Winston et al. |
| 8,616,447 B2 | 12/2013 | Bianco |
| D697,064 S | 1/2014 | Chen |
| D697,864 S | 1/2014 | McGrath |
| D700,901 S | 3/2014 | Giglio et al. |
| D704,265 S | 5/2014 | Yan |
| D708,573 S | 7/2014 | Gieniec et al. |
| D710,298 S | 8/2014 | Jie et al. |
| D712,367 S | 9/2014 | Park et al. |
| 8,819,968 B1 * | 9/2014 | Van Beek ............ G09F 27/007 40/605 |
| D717,472 S | 11/2014 | Indio da Costa et al. |
| 8,895,836 B2 | 11/2014 | Amin et al. |
| D719,120 S | 12/2014 | Park et al. |
| 8,919,778 B2 | 12/2014 | Fodera |
| D728,557 S | 5/2015 | Soares |
| D730,858 S | 6/2015 | Yoon et al. |
| D731,189 S | 6/2015 | Kim |
| D731,408 S | 6/2015 | Ko |
| D734,074 S | 7/2015 | Jouin |
| D734,965 S | 7/2015 | Tio et al. |
| D739,464 S | 9/2015 | Liu et al. |
| 9,121,391 B1 | 9/2015 | Koehler, III |
| D740,966 S | 10/2015 | Indio da Costa et al. |
| D747,222 S | 1/2016 | Indio da Costa et al. |
| D747,816 S | 1/2016 | Indio da Costa et al. |
| 9,235,232 B2 | 1/2016 | King |
| D752,529 S | 3/2016 | Loretan et al. |
| 9,282,676 B1 | 3/2016 | Diaz |
| D754,256 S | 4/2016 | Maman et al. |
| 9,313,447 B2 | 4/2016 | Dunn et al. |
| 9,317,060 B2 | 4/2016 | Dunn et al. |
| D757,180 S | 5/2016 | Indio da Costa et al. |
| D759,617 S | 6/2016 | Soares |
| D761,221 S | 7/2016 | Kim et al. |
| D775,622 S | 1/2017 | Fu et al. |
| D776,651 S | 1/2017 | Yates |
| D777,695 S | 1/2017 | Odryna et al. |
| D783,596 S | 4/2017 | Payne et al. |
| D785,200 S | 4/2017 | Indio da Costa et al. |
| D786,453 S | 5/2017 | Indio da Costa et al. |
| D786,454 S | 5/2017 | Indio da Costa et al. |
| 9,655,289 B2 | 5/2017 | Dunn et al. |
| D789,313 S | 6/2017 | Jacobi |
| D791,069 S | 7/2017 | Mota et al. |
| 9,703,320 B2 | 7/2017 | Bowers et al. |
| D795,453 S | 8/2017 | Indio da Costa et al. |
| D797,658 S | 9/2017 | Feller et al. |
| 9,756,739 B2 | 9/2017 | Russell-Clarke et al. |
| D801,914 S | 11/2017 | Bauer et al. |
| D804,054 S | 11/2017 | Indio da Costa et al. |
| 9,823,690 B2 | 11/2017 | Bowers et al. |
| D806,895 S | 1/2018 | Terashima et al. |
| D807,840 S | 1/2018 | Lee et al. |
| 9,857,618 B2 | 1/2018 | Barnes |
| D812,384 S | 3/2018 | Zhu |
| D813,802 S | 3/2018 | Krantz et al. |
| 9,943,017 B2 | 4/2018 | Bouissiere et al. |
| D816,624 S | 5/2018 | Odryna et al. |
| D817,288 S | 5/2018 | Won et al. |
| D820,798 S | 6/2018 | Yurusov |
| D830,982 S | 10/2018 | Bakshi |
| D831,599 S | 10/2018 | Chong et al. |
| 10,120,419 B2 * | 11/2018 | Tatsuta ................ G06F 3/011 |
| 10,143,106 B2 | 11/2018 | Diaz |
| D835,926 S | 12/2018 | Abatemarco, Jr. |
| D839,352 S | 1/2019 | Lim et al. |
| 10,194,564 B2 | 1/2019 | Dunn et al. |
| 10,212,845 B2 | 2/2019 | Dunn et al. |
| D844,554 S | 4/2019 | Franklin |
| D844,559 S | 4/2019 | Mercer et al. |
| 10,278,311 B2 | 4/2019 | DeMars |
| 10,290,243 B2 | 5/2019 | Lanham |
| D850,438 S | 6/2019 | Koenigsknecht et al. |
| D852,273 S | 6/2019 | Lim et al. |
| D852,274 S | 6/2019 | Lim et al. |
| D854,089 S | 7/2019 | Topcuoglu |
| D856,530 S | 8/2019 | Oskoui |
| 10,398,058 B2 | 8/2019 | Diaz |
| 10,401,016 B2 | 9/2019 | Coo |
| D861,623 S | 10/2019 | Odryna et al. |
| D861,625 S | 10/2019 | Ahn et al. |
| D863,597 S | 10/2019 | Li et al. |
| D864,957 S | 10/2019 | Yüksek et al. |
| D864,958 S | 10/2019 | Yüksek et al. |
| 10,485,147 B2 * | 11/2019 | Oh ................ H05K 7/2099 |
| D869,412 S | 12/2019 | Spencer et al. |
| D869,413 S | 12/2019 | Spencer et al. |
| D870,724 S | 12/2019 | Yüksek et al. |
| D873,268 S | 1/2020 | Yüksek et al. |
| D876,346 S | 2/2020 | Mercer et al. |
| D879,096 S | 3/2020 | Yüksek et al. |
| D879,202 S | 3/2020 | Hornsby et al. |
| 10,602,626 B2 | 3/2020 | Dunn |
| D880,591 S | 4/2020 | Lee et al. |
| D880,593 S | 4/2020 | Lee et al. |
| D883,278 S | 5/2020 | Yepez et al. |
| D885,382 S | 5/2020 | Kim et al. |
| D886,096 S | 6/2020 | Mangeot |
| D890,710 S | 7/2020 | Bakshi |
| 10,716,224 B2 * | 7/2020 | Dunn ................ H05K 5/0017 |
| 10,757,844 B2 | 8/2020 | Dunn et al. |
| D900,221 S | 10/2020 | Dance |
| 10,820,445 B2 | 10/2020 | Diaz |
| 10,827,644 B2 | 11/2020 | Diaz |
| 10,827,657 B2 | 11/2020 | Lee |
| 10,831,050 B2 | 11/2020 | Dunn et al. |
| 10,844,995 B1 | 11/2020 | Wang et al. |
| 10,925,174 B2 | 2/2021 | Dunn et al. |
| D911,992 S | 3/2021 | Stinson et al. |
| D913,276 S | 3/2021 | Dunn |
| D913,277 S | 3/2021 | Dunn |
| D913,278 S | 3/2021 | Dunn |
| D913,374 S | 3/2021 | Lee et al. |
| D916,189 S | 4/2021 | Dunn |
| D916,190 S | 4/2021 | Dunn |
| D916,319 S | 4/2021 | Dunn |
| D916,971 S | 4/2021 | Dunn |
| D916,972 S | 4/2021 | Dunn |
| D916,973 S | 4/2021 | Dunn |
| D916,974 S | 4/2021 | Dunn |
| D916,975 S | 4/2021 | Dunn |
| D916,976 S | 4/2021 | Dunn |
| D916,977 S | 4/2021 | Dunn |
| 10,999,941 B2 | 5/2021 | Dunn |
| D924,187 S | 7/2021 | Park et al. |
| D925,484 S | 7/2021 | Easton |
| D927,595 S | 8/2021 | Ogden et al. |
| D929,355 S | 8/2021 | Diao et al. |
| D931,663 S | 9/2021 | Tio et al. |
| 11,117,482 B2 | 9/2021 | Mercer et al. |
| D933,589 S | 10/2021 | Thanh Ly |
| D934,159 S | 10/2021 | Dunn et al. |
| 11,148,621 B2 | 10/2021 | Dunn et al. |
| D934,827 S | 11/2021 | Stinson et al. |
| D935,426 S | 11/2021 | Stinson et al. |

(56) References Cited

U.S. PATENT DOCUMENTS

| | | |
|---|---|---|
| 11,206,750 B2 * | 12/2021 | Lee .................. G01K 1/02 |
| D941,235 S | 1/2022 | Dunn et al. |
| D941,236 S | 1/2022 | Dunn et al. |
| D948,499 S | 4/2022 | Inouye et al. |
| D949,971 S | 4/2022 | Lee et al. |
| D949,972 S | 4/2022 | Lee et al. |
| D957,317 S | 7/2022 | Dunn |
| D958,059 S | 7/2022 | Dunn |
| D958,246 S | 7/2022 | Huang et al. |
| D961,944 S | 8/2022 | Shen |
| D962,856 S | 9/2022 | Mercer et al. |
| D964,920 S | 9/2022 | Dunn |
| D967,011 S | 10/2022 | Mercer et al. |
| D967,012 S | 10/2022 | Mercer et al. |
| D967,045 S | 10/2022 | Park et al. |
| D969,066 S | 11/2022 | Dunn |
| D969,067 S | 11/2022 | Dunn |
| D969,068 S | 11/2022 | Dunn |
| 11,496,091 B2 | 11/2022 | Dunn et al. |
| D971,865 S | 12/2022 | Kim et al. |
| D971,915 S | 12/2022 | Cho et al. |
| D979,490 S | 2/2023 | Pinon et al. |
| D988,992 S | 6/2023 | Moreira da Silva et al. |
| D989,018 S | 6/2023 | Kim et al. |
| D990,443 S | 6/2023 | Lee et al. |
| D993,906 S | 8/2023 | Dunn |
| D993,909 S | 8/2023 | Dunn |
| D1,002,642 S | 10/2023 | Mistry et al. |
| D1,005,248 S | 11/2023 | Lee et al. |
| D1,005,934 S | 11/2023 | Dunn |
| D1,005,937 S | 11/2023 | Mercer et al. |
| D1,005,938 S | 11/2023 | Mercer et al. |
| 11,822,171 B2 | 11/2023 | Dunn et al. |
| 11,824,495 B2 | 11/2023 | Dunn et al. |
| D1,010,858 S | 1/2024 | Dunn |
| D1,018,896 S | 3/2024 | Dunn |
| 11,934,054 B2 | 3/2024 | Dunn et al. |
| D1,025,882 S | 5/2024 | Dunn |
| 2001/0032404 A1 | 10/2001 | Hillstrom |
| 2001/0043290 A1 | 11/2001 | Yamamoto |
| 2001/0043293 A1 | 11/2001 | Inoue |
| 2002/0009978 A1 | 1/2002 | Dukach et al. |
| 2002/0149714 A1 | 10/2002 | Anderson et al. |
| 2003/0039094 A1 | 2/2003 | Sarkinen et al. |
| 2004/0025389 A1 | 2/2004 | Peterson |
| 2004/0103570 A1 | 6/2004 | Ruttenberg |
| 2004/0212548 A1 | 10/2004 | Ruttenberg |
| 2004/0257492 A1 | 12/2004 | Mai et al. |
| 2005/0105178 A1 | 5/2005 | Kim |
| 2005/0127796 A1 | 6/2005 | Olesen et al. |
| 2006/0012985 A1 | 1/2006 | Archie, Jr. et al. |
| 2006/0077636 A1 | 4/2006 | Kim |
| 2006/0137294 A1 | 6/2006 | Waits et al. |
| 2006/0144987 A1 | 7/2006 | Clark |
| 2006/0215421 A1 | 9/2006 | Chang et al. |
| 2006/0218828 A1 | 10/2006 | Schrimpf et al. |
| 2007/0021217 A1 | 1/2007 | Wu |
| 2007/0070615 A1 | 3/2007 | Joslin et al. |
| 2007/0139574 A1 | 6/2007 | Ko et al. |
| 2007/0159035 A1 | 7/2007 | Mullen |
| 2007/0253205 A1 | 11/2007 | Welker |
| 2008/0002350 A1 | 1/2008 | Farrugia |
| 2008/0054144 A1 | 3/2008 | Wohlford |
| 2008/0100186 A1 * | 5/2008 | Li .................. H04N 5/645 312/223.2 |
| 2008/0174456 A1 | 7/2008 | Warren |
| 2008/0236005 A1 | 10/2008 | Isayev et al. |
| 2008/0255901 A1 | 10/2008 | Carroll et al. |
| 2008/0276507 A1 | 11/2008 | Hines |
| 2008/0298051 A1 | 12/2008 | Chu |
| 2008/0304219 A1 * | 12/2008 | Chen .................. G09F 9/33 361/829 |
| 2009/0009041 A1 | 1/2009 | Zeidler |
| 2009/0016004 A1 | 1/2009 | McCoy |
| 2009/0050194 A1 | 2/2009 | Noble et al. |
| 2009/0104989 A1 | 4/2009 | Williams et al. |
| 2009/0126906 A1 | 5/2009 | Dunn |
| 2009/0126907 A1 | 5/2009 | Dunn |
| 2009/0141199 A1 | 6/2009 | Fujikawa |
| 2009/0183405 A1 | 7/2009 | Wilkes |
| 2009/0231807 A1 | 9/2009 | Bouissiere |
| 2009/0241388 A1 | 10/2009 | Dunn |
| 2009/0241437 A1 | 10/2009 | Steinle et al. |
| 2009/0278007 A1 | 11/2009 | Taylor |
| 2009/0279240 A1 | 11/2009 | Karppanen |
| 2010/0079979 A1 | 4/2010 | Nakamichi et al. |
| 2010/0171889 A1 | 7/2010 | Pantel et al. |
| 2010/0220249 A1 | 9/2010 | Nakamichi et al. |
| 2010/0226091 A1 | 9/2010 | Dunn |
| 2011/0019348 A1 | 1/2011 | Kludt et al. |
| 2011/0075363 A1 * | 3/2011 | Nakamichi .................. G09F 9/35 361/696 |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0134356 A1 | 6/2011 | Swatt et al. |
| 2011/0141672 A1 | 6/2011 | Farley, Jr. et al. |
| 2011/0227467 A1 | 9/2011 | Foppe, Jr. et al. |
| 2011/0240093 A1 | 10/2011 | Tucker |
| 2011/0297810 A1 | 12/2011 | Tachibana |
| 2011/0298841 A1 | 12/2011 | Fujimori |
| 2012/0050958 A1 | 3/2012 | Sanford et al. |
| 2012/0105424 A1 | 5/2012 | Lee et al. |
| 2012/0162878 A1 | 6/2012 | Fukuma et al. |
| 2012/0224116 A1 | 9/2012 | Barnes |
| 2012/0253672 A1 | 10/2012 | Hoshino et al. |
| 2012/0268686 A1 | 10/2012 | Lee et al. |
| 2012/0312348 A1 | 12/2012 | Fereday |
| 2013/0033222 A1 | 2/2013 | Hixson et al. |
| 2013/0211583 A1 | 8/2013 | Borra |
| 2013/0270975 A1 | 10/2013 | Dunn et al. |
| 2013/0294039 A1 | 11/2013 | Chao |
| 2013/0300360 A1 | 11/2013 | Kobayashi et al. |
| 2013/0329363 A1 | 12/2013 | Dunn et al. |
| 2014/0044147 A1 | 2/2014 | Wyatt et al. |
| 2014/0055914 A1 | 2/2014 | Fournier |
| 2014/0208626 A1 * | 7/2014 | Moon .................. G09F 15/0012 40/729 |
| 2015/0009627 A1 | 1/2015 | Dunn et al. |
| 2015/0173237 A1 * | 6/2015 | Lin .................. H05K 1/0203 361/736 |
| 2015/0194561 A1 | 7/2015 | Toya et al. |
| 2015/0211676 A1 | 7/2015 | Martin et al. |
| 2015/0249353 A1 | 9/2015 | Hamilton et al. |
| 2015/0264826 A1 | 9/2015 | Dunn et al. |
| 2015/0381922 A1 | 12/2015 | Hamilton |
| 2016/0132849 A1 | 5/2016 | Melo et al. |
| 2016/0192536 A1 | 6/2016 | Diaz |
| 2016/0242329 A1 | 8/2016 | DeMars |
| 2017/0040789 A1 | 2/2017 | Bonilla et al. |
| 2017/0074453 A1 | 3/2017 | Bowers et al. |
| 2017/0083043 A1 | 3/2017 | Bowers et al. |
| 2017/0132960 A1 | 5/2017 | Kis-Benedek Pinero et al. |
| 2017/0231112 A1 | 8/2017 | Dunn et al. |
| 2017/0345346 A1 | 11/2017 | Hong et al. |
| 2018/0210492 A1 * | 7/2018 | Chen .................. F04B 49/06 |
| 2018/0247575 A1 | 8/2018 | Konde |
| 2018/0272959 A1 | 9/2018 | Hornsby et al. |
| 2018/0293921 A1 | 10/2018 | Margrill |
| 2018/0315356 A1 | 11/2018 | Dunn et al. |
| 2018/0317330 A1 | 11/2018 | Dunn et al. |
| 2018/0345809 A1 | 12/2018 | Derrien et al. |
| 2019/0056058 A1 | 2/2019 | Pell et al. |
| 2019/0059175 A1 | 2/2019 | Diaz |
| 2019/0196251 A1 | 6/2019 | Woo et al. |
| 2019/0239365 A1 | 8/2019 | Dunn et al. |
| 2019/0250651 A1 * | 8/2019 | Liu .................. G05D 16/2066 |
| 2019/0335613 A1 | 10/2019 | Diaz |
| 2020/0037456 A1 | 1/2020 | Dunn |
| 2020/0150597 A1 * | 5/2020 | Aghara .................. A61B 5/6843 |
| 2020/0163234 A1 | 5/2020 | Dunn |
| 2020/0288585 A1 | 9/2020 | Dunn et al. |
| 2020/0383246 A1 * | 12/2020 | Lee .................. G09F 19/22 |

(56) References Cited

U.S. PATENT DOCUMENTS

| | | |
|---|---|---|
| 2021/0066923 A1 | 3/2021 | Dunn et al. |
| 2021/0168949 A1 | 6/2021 | Dunn et al. |
| 2021/0304644 A1 | 9/2021 | Webster |
| 2021/0313927 A1 | 10/2021 | Dunn et al. |
| 2021/0397010 A1* | 12/2021 | Mou .................. G06F 1/203 |
| 2022/0035198 A1 | 2/2022 | Dunn et al. |
| 2022/0327968 A1 | 10/2022 | Wesley et al. |
| 2023/0030376 A1 | 2/2023 | Dunn et al. |
| 2023/0287670 A1 | 9/2023 | Ethier |
| 2024/0027806 A1 | 1/2024 | Dunn et al. |
| 2024/0096246 A1 | 3/2024 | Dunn et al. |
| 2024/0096247 A1 | 3/2024 | Dunn et al. |
| 2024/0098919 A1 | 3/2024 | Dunn et al. |

FOREIGN PATENT DOCUMENTS

| | | |
|---|---|---|
| AU | 2022202810 B2 | 11/2023 |
| CA | 2780884 C | 4/2019 |
| CA | 2942321 C | 6/2022 |
| CA | 3106866 C | 11/2023 |
| CN | 300909628 S | 4/2009 |
| CN | 302484867 S | 6/2013 |
| CN | 302553463 S | 8/2013 |
| CN | 304160145 | 6/2017 |
| CN | 304160150 | 6/2017 |
| CN | 304170664 | 6/2017 |
| CN | 206610564 U | 11/2017 |
| CN | 213183232 U | 5/2021 |
| CN | 214171740 U | 9/2021 |
| CN | 219317994 U | 7/2023 |
| EM | 001782137-0002 | 11/2010 |
| EM | 002129171-0001 | 11/2012 |
| EM | 004506814-0001 | 11/2017 |
| EM | 007177118-0001 | 11/2019 |
| EM | 008035232-0001 | 7/2020 |
| EM | 015031795-0001 | 8/2023 |
| EM | 015031795-0002 | 8/2023 |
| EM | 015031795-0003 | 8/2023 |
| EM | 015031795-0004 | 8/2023 |
| EM | 015031795-0005 | 8/2023 |
| EM | 015031795-0006 | 8/2023 |
| EM | 015044249-0001 | 12/2023 |
| EP | 3468321 A1 | 4/2019 |
| EP | 3117693 B1 | 8/2019 |
| EP | 3468321 B1 | 4/2021 |
| EP | 3830464 A1 | 6/2021 |
| EP | 4022595 A1 | 7/2022 |
| FR | 071744-001 | 4/2007 |
| GB | 153110 | 11/1920 |
| GB | 2099232 | 2/2001 |
| GB | 8071975000-1000 | 3/2009 |
| GB | 2483703 A | 3/2012 |
| GB | 9003585090-0001 | 1/2017 |
| GB | 8098725000-1000 | 4/2017 |
| GB | 9005633500-0003 | 9/2018 |
| GB | 6304834 | 8/2023 |
| GB | 6304835 | 8/2023 |
| GB | 6304836 | 8/2023 |
| GB | 6304837 | 8/2023 |
| GB | 6304838 | 8/2023 |
| GB | 6304839 | 8/2023 |
| GB | 6333108 | 12/2023 |
| HU | 92378-0001 | 12/2015 |
| JP | 2005292939 A | 10/2005 |
| JP | 2005332253 A | 12/2005 |
| JP | 2006198344 A | 8/2006 |
| JP | 2009-44262 A | 2/2009 |
| JP | 7395715 B2 | 12/2023 |
| KR | 200163508 Y1 | 7/2000 |
| KR | 200206768 Y1 | 12/2000 |
| KR | 200236278 Y1 | 10/2001 |
| KR | 2002-0057425 A | 7/2002 |
| KR | 200286961 Y1 | 8/2002 |
| KR | 200366674 Y1 | 11/2004 |
| KR | 300325739.0001 | 10/2005 |
| KR | 300405118.0000 | 1/2006 |
| KR | 300405120.0000 | 1/2006 |
| KR | 300422537.0000 | 8/2006 |
| KR | 300439769.0000 | 2/2007 |
| KR | 300479026.0000 | 1/2008 |
| KR | 3020080000750 | 5/2008 |
| KR | 300560243.0000 | 5/2010 |
| KR | 300582822.0000 | 12/2010 |
| KR | 300593928.0000 | 3/2011 |
| KR | 30-0606958 S | 7/2011 |
| KR | 300616289.0000 | 10/2011 |
| KR | 300618395.0000 | 10/2011 |
| KR | 300618437.0000 | 10/2011 |
| KR | 300639738.0000 | 4/2012 |
| KR | 300658770.0000 | 9/2012 |
| KR | 300661754.0001 | 10/2012 |
| KR | 300708992.0000 | 9/2013 |
| KR | 300740096.0000 | 4/2014 |
| KR | 10-1444022 B1 | 10/2014 |
| KR | 300780344.0001 | 1/2015 |
| KR | 300834837.0000 | 1/2016 |
| KR | 300846418.0000 | 3/2016 |
| KR | 300852376.0000 | 4/2016 |
| KR | 300869130.0000 | 8/2016 |
| KR | 300906413.0000 | 5/2017 |
| KR | 300923015.0000 | 9/2017 |
| KR | 300986783.0000 | 12/2018 |
| KR | 301000494.0000 | 4/2019 |
| KR | 301084745.0000 | 11/2020 |
| KR | 10-2379046 B1 | 3/2022 |
| KR | 10-2512657 B1 | 3/2023 |
| WO | D020525-002 | 8/1991 |
| WO | WO2011059793 A2 | 5/2011 |
| WO | WO2012006620 A2 | 1/2012 |
| WO | 2012/035362 A1 | 3/2012 |
| WO | D080968-001 | 5/2013 |
| WO | 2015138609 A2 | 9/2015 |
| WO | 2016102980 A1 | 6/2016 |
| WO | D098725-001 | 12/2017 |
| WO | 2018/185364 A1 | 10/2018 |
| WO | 2020028045 A1 | 2/2020 |
| WO | 2021/041381 A1 | 3/2021 |
| WO | 2024/049953 A1 | 3/2024 |

OTHER PUBLICATIONS

The Free Dictionary, Screw—Definition of screw by The Free Dictionary, Jun. 15, 2016, 1 Page.
I-Tech Company, 65 Outdoor Digital Signage Sunlight All Weather Proof LCD, 1 Page.
SUNLIGHTLCD.COM, 46 All Weather NEMA4 Outdoor High Brightness (Model: GS4600L), Mar. 11, 2009, 2 Pages.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Civiq, Invalidity Contentions, Jan. 24, 2018, 51 pages.
Civiq, Invalidity Claim Chart, Appendix E, Jan. 24, 2018, 28 pages.
Civiq, Invalidity Claim Chart, Appendix I, Mar. 22, 2018, 4 pages.
Civiq, Smart City Devices, webpage, Jan. 30, 2019, 5 pages.
Civiq, Smart City Platform, webpage, Jan. 30, 2019, 10 pages.
Civiq, Smartscapes devices, webpage, Jan. 30, 2019, 1 page.
Miller, Adnation, photos, May 9, 2017, 28 pages.
Civiq Smartscapes, There are companies that make kiosks. And then there's Civiq.—Advanced Smart City Platform, webpage, Jan. 30, 2019, 10 pages.
Civiq Smartscapes, Connecting people, places & experiences, webpage, Jan. 30, 2019, 5 pages.
Civiq Smartscapes, Connecting people, places & experiences, screen shot of devices webpage, Jan. 30, 2019, 1 page.
Melford Technologies, Part 1, video online at https://m.youtube.com/watch?v=OAV7zzVrHtE&feature=youtu.be, Oct. 21, 2019, 1 page.

(56) References Cited

OTHER PUBLICATIONS

Manufacturing Resources International, Manufacturing Resources International home webpage, Nov. 4, 2019, 2 pages.
Manufacturing Resources International, LCD Display Deployments webpage, Nov. 4, 2019, 3 pages.
Manufacturing Resources International, BoldVu Outdoor LCD Display webpage, Nov. 4, 2019, 2 pages.
Manufacturing Resources International, BoldVu Semi Outdoor LCD Display webpage, Nov. 8, 2019, 2 pages.
Manufacturing Resources International, BoldVu Vehicle Top LCD Display webpage, Nov. 8, 2019, 2 pages.
Manufacturing Resources International, Drivethru Menu Boards Webpage, Nov. 8, 2019, 2 pages.
Manufacturing Resources International, Storefront Digital Signage webpage, Nov. 8, 2019, 2 pages.
Gable, Blog Post: The Anatomy of an Interactive Kiosk, Aug. 15, 2018, 4 pages.
Abrons, S., ISE 2024: MRI, Inc. Shows Boldvu Outdoor LCD Displays, Talks Patented Brightness Level, Rave [PUBS], retrieved from https://www.ravepubs.com/rave-video/ise-2024-mri-inc-shows-boldvu-outdoor-LCD-displays-talks-patented-brightness-level/, Feb. 4, 2024, 2 pages.
Manufacturing Resources International, BoldVu, LCD Display Deployments, retrieved from https://web.archive.org/web/20230924073721/https://mri-inc.net/LCD-display-deployments/, The Wayback Machine, Sep. 24, 2023, 7 pages.

* cited by examiner

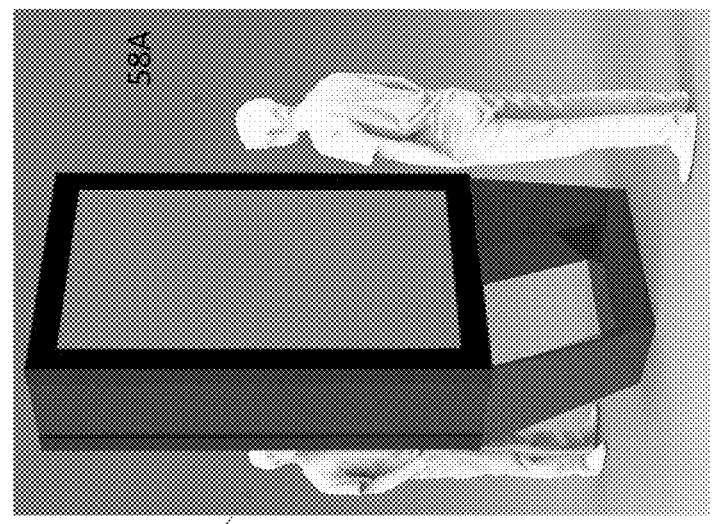
Figure 7C
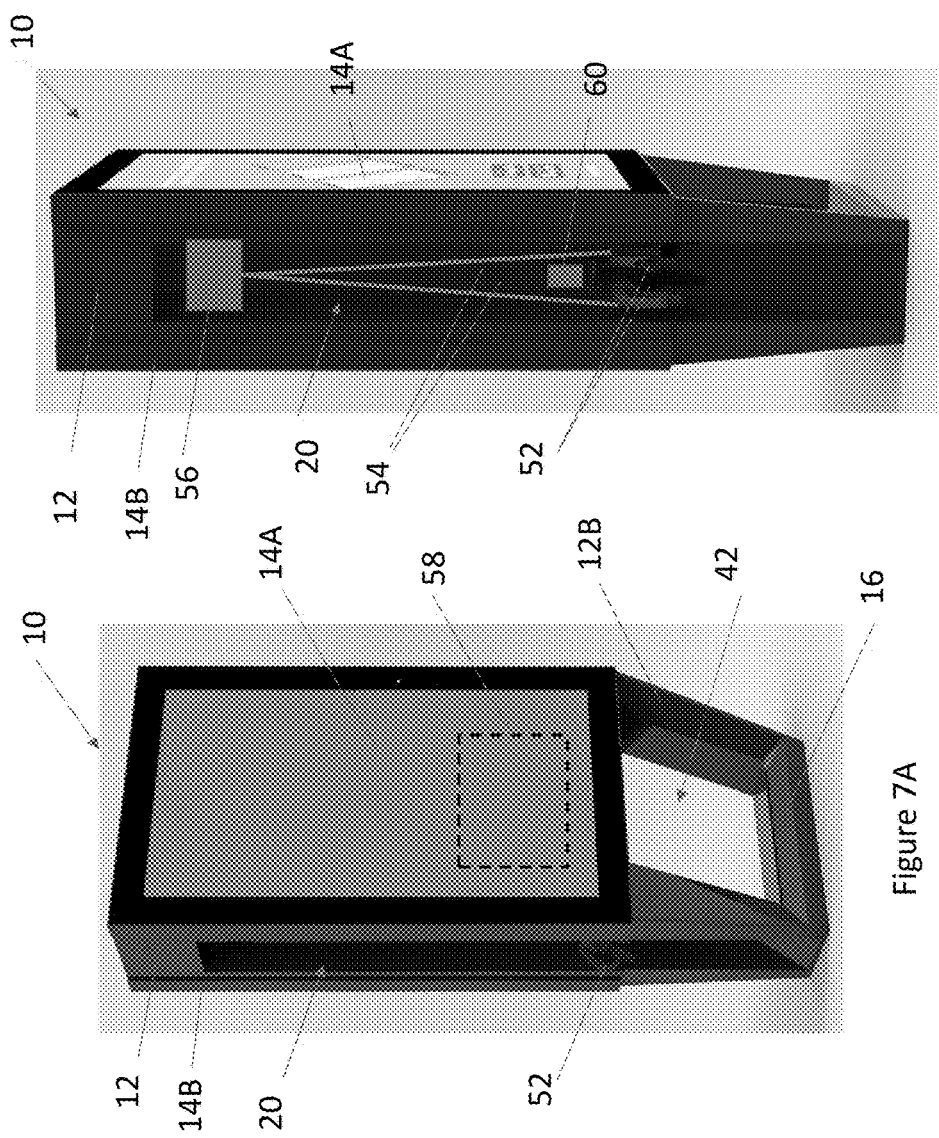
Figure 7B
Figure 7A

DISPLAY ASSEMBLY WITH UNOBSTRUCTED ZONE

CROSS-REFERENCE TO RELATED APPLICATIONS

This application is a continuation of U.S. application Ser. No. 17/976,054 filed Oct. 28, 2022, which is a continuation-in-part of U.S. application Ser. No. 17/900,382 filed Aug. 31, 2022, the disclosures of which are hereby incorporated by reference as if fully restated herein.

TECHNICAL FIELD

Exemplary embodiments relate generally to display assemblies with at least one unobstructed zone, as well as systems and methods for the same.

BACKGROUND AND SUMMARY OF THE INVENTION

The demand for digital out of home ("DOOH") advertising units has grown significantly in recent years. It is known to provide electronic displays in ruggedized housings for outdoor placement. Where such units are configured for mounting to a sidewalk or other ground surface, they are typically provided as a monolithic structure. Such units generally include one or more elevated electronic displays and a closed, lower or upper cavity, thereby presenting an unbroken, or substantially unbroken, exterior. The elevated nature of the electronic displays permits an ergonomic viewing height and may confirm to various regulations or other rules, such as the Americans with Disabilities Act. The monolithic structure approach presents a seamless appearance, permits storage of sensitive electronic equipment, wiring, mounting, or other components within the upper or lower cavities, which may permit cooling, powering, and/or network connectivity of the same and/or enhance structural integrity, by way of non-limiting example.

A display assembly is disclosed having one or more unstructured zones. For a variety of reasons, it may be desirable to leave one or more portions of the units unobstructed. For example, this may permit viewing through and beyond the units, such as to make other people, cars, or the like, visible on the other side of the unit. This may improve pedestrian safety. This may increase aerodynamics, improving structural resistance to forces such as strong winds. This may increase airflow, such as by providing unobstructed zones near intakes and/or exhausts, such as for thermal management needs. This may increase clearance for radio signals, such as to improve transmission/reception of the same. These are some non-limiting examples.

In exemplary embodiments, without limitation, one or more side assemblies, each comprising at least one electronic display, are mounted to a framework. One or more side assemblies may be utilized. For example, without limitation, two side assemblies may be provided on opposing sides of the framework, such as in a back-to-back orientation. The side assemblies may be mounted for movement relative to the framework, such as to permit access to the side assemblies and/or an interior compartment.

The side assemblies may be mounted in an elevated position such that the unobstructed zone extends below the side assemblies, by way of non-limiting example. Wiring, such as for power, network connectivity, combinations thereof, or the like, may extend within or along one or more members of the framework, such as to the side assemblies and/or an internal compartment located between the side assemblies of a given unit. Alternatively, or additionally, certain electronic components may be mounted to the one or more member(s) of the framework which are covered with cladding so as to preserve the unobstructed zone. In this fashion, the units may be powered and/or connected to a network while preserving the unobstructed zone(s) and shielding the sensitive components (e.g., wiring, electronic components) from harsh weather, vandalism, or the like.

One or more support members may extend from the framework to the side assemblies, such as to suspend the side assemblies within the framework at the elevated position. This may provide additional unobstructed zones, such as along left, right, and/or upper sides of the side assemblies. Wiring or other components may be provided within such support member(s).

Optionally, additional equipment may be provided. Such equipment may include, for example without limitation, electric vehicle (EV) charging equipment and/or wireless communications equipment. At least some of the EV charging equipment may be located internal to the framework and at least some other portions of the EV charging equipment may be located external to the framework, such as within a recessed compartment. Cable management devices, such as cable reels, may be provided to provide cable retraction and/or organization of EV charger cables. Wireless communications equipment may be located in a communications compartment located above the side assemblies. The wireless communications equipment may share power and/or data connectivity with the side assemblies and/or EV charging equipment.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 7A is a front perspective view of another exemplary embodiment of the display assembly with an unobstructed zone;

FIG. 7B is a side perspective view of the display assembly of FIG. 7A;

FIG. 7C is a front perspective view of the display assembly of FIG. 7A with exemplary users illustrated.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
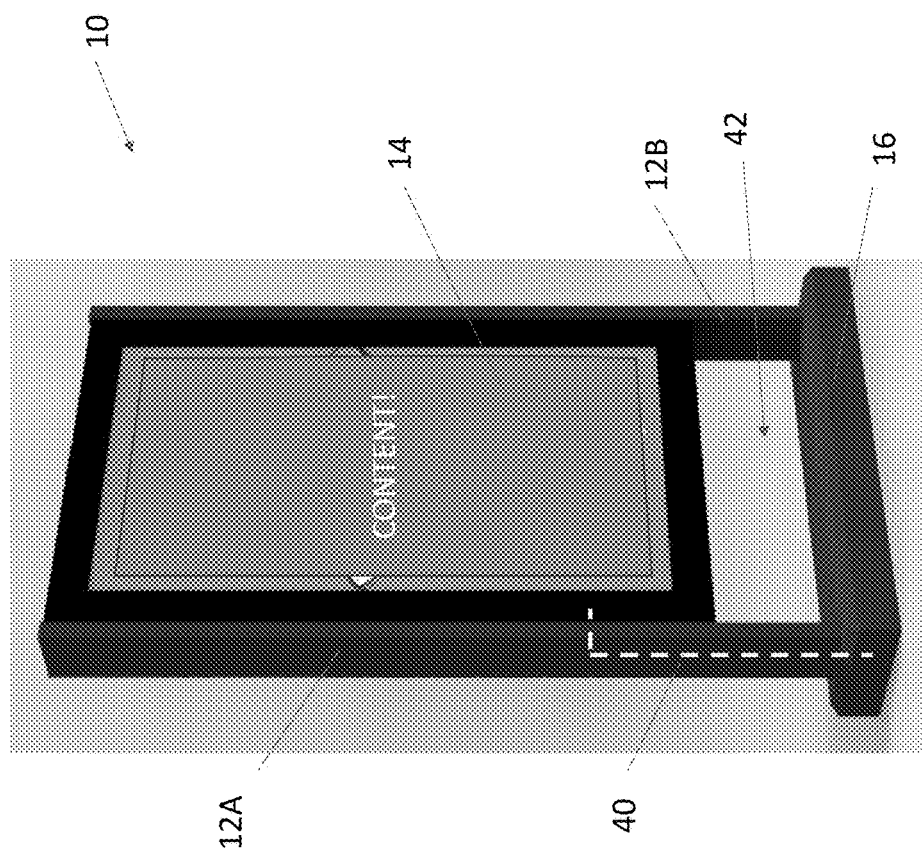
FIG. 1 is a perspective view of a display assembly with an unobstructed zone.

FIG. 1 illustrates an exemplary display assembly 10. The assembly 10 may comprise a framework 12. The framework 12 may comprise multiple members. The members may be constructed of steel, aluminum, an alloy, combinations thereof, or the like. Some of the members may extend substantially upward (e.g., vertically) and others may extend substantially laterally (e.g., horizontally). However, any number, size, shape, type, and/or orientation of members may be utilized to form any size and/or shape framework 12. In exemplary embodiments, a first member 12A and a second member 12B may extend in a generally upward direction from a base 16. The first and second members 12A, 12B may be spaced apart from one another, such as to accommodate one or more side assemblies 14.

The base 16 may be configured for mounting to a sidewalk, parking lot, or other ground surface. The base 16 may extend between members of the framework 12, such as the first and second members 12A, 12B. The base 16 may extend laterally and/or horizontally.

Figure 2:
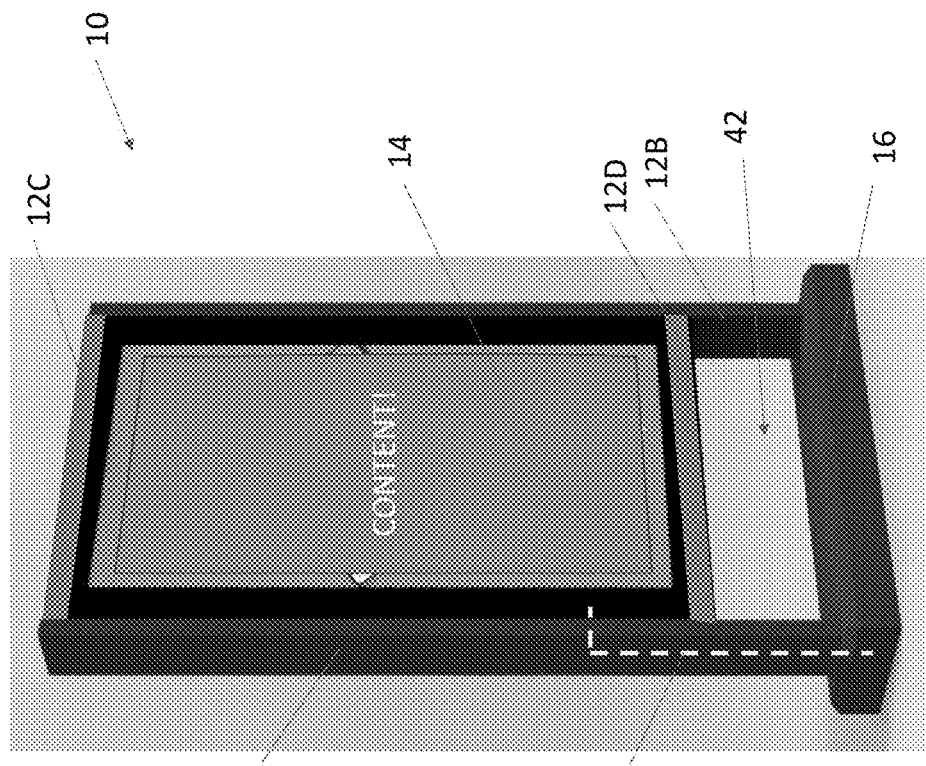
FIG. 2 is a perspective view of another exemplary display assembly with an unobstructed zone.

As illustrated with particular regard to at least FIG. 2 the framework 12 may comprise a third member 12C and a fourth member 12D. The third member 12C and the fourth member 12D may each extend between the first member 12A and the second member 12B in exemplary embodiments, without limitation. The third and fourth members 12C, 12D may be spaced apart from one another, such as to accommodate the one or more side assemblies 14.

The side assemblies 14 (sometimes also referred to as display subassemblies and/or electronic display subassemblies) may be positioned such that front surfaces are flush, or substantially flush, with the third and/or fourth members 12C, 12D. Alternatively, the display subassemblies 14 may be positioned such that the front surfaces are recessed relative to the third and/or fourth members 12C, 12D.

One or more side assemblies 14 may be connected to said framework 12. A first and second electronic display subassembly 14 may be mounted to a given framework 12 in opposing directions, such as in a back-to-back arrangement by way of non-limiting example. Each of the display subassemblies 14 may comprise one or more electronic displays. The side assemblies 14 may comprise BOLDVU® displays available from Manufacturing Resources International, Inc. of Alpharetta, Georgia (https://mri-inc.net/) by way of non-limiting example. The side assemblies 14 may, separately and/or when made part of the assemblies 10, include technology and/or components shown and/or described in one or more of: U.S. Pat. No. 8,373,841 issued Feb. 12, 2013, U.S. Pat. No. 8,351,014 issued Jan. 8, 2013, U.S. Pat. No. 10,398,066 issued Aug. 27, 2019, and/or 10,499,516 issued Dec. 3, 2019, by way of non-limiting examples, the disclosures of each of which are hereby incorporated by reference.

The side assemblies 14 may comprise any number, size, and/or shape electronic display, such as but not limited to 55-inch displays, 65-inch displays, 75-inch displays, 82-inch displays, 86-inch displays, and 98-inch displays, combinations thereof, or the like.

Figure 3B:
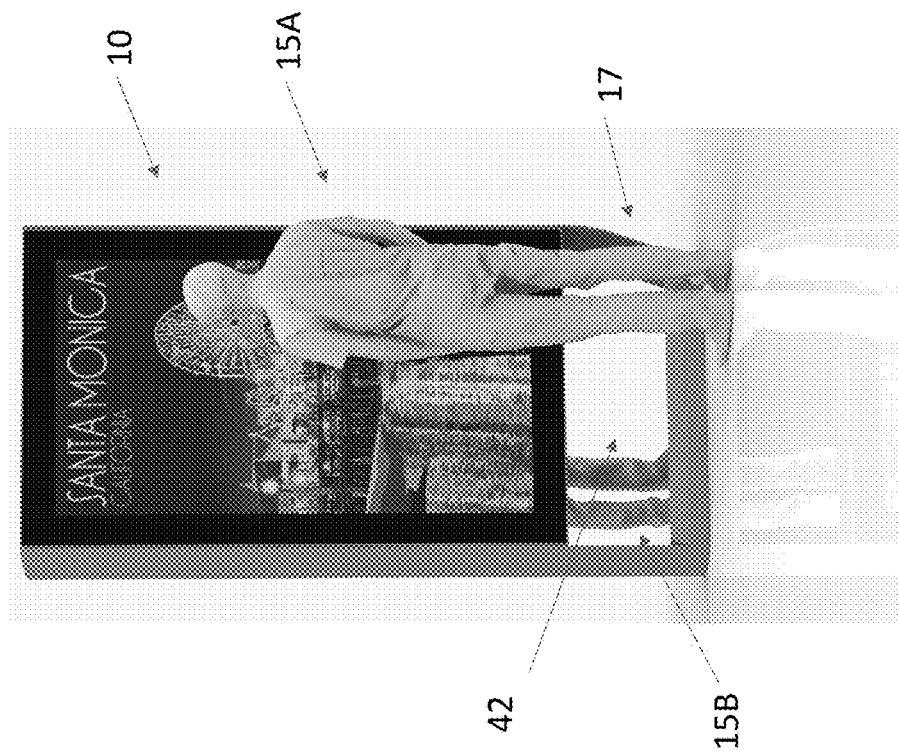
FIG. 3B is a perspective view of the display assembly of FIG. 3A in exemplary use with two users.

In exemplary embodiments, without limitation, the side assemblies 14 may be mounted to same framework 12 in an elevated position above a ground surface. This may leave an unobstructed zone 42 within the framework 12, such as below the side assemblies 14 and above a ground surface and/or the base 16. For example, without limitation, the unobstructed zone 42 may extend interior to the first and second members 12A, 12B, below the one or more side assemblies 14, and above the base 16. The unobstructed zone 42 may be entirely devoid of components, such that space through and beyond the assembly 10 is visible and/or ambient air (e.g., wind) is permitted to pass therethrough, in exemplary embodiments, without limitation. In exemplary embodiments, without limitation, the unobstructed zone 42 may extend along an entire lower surface of the subassemblies 14, though such is not necessarily required. An example of such a unit 10 in use is shown, by way of non-limiting example, in FIG. 3B which illustrates user 15A, 15B on different sides of the unit 10 visible, in part, through the unobstructed zone 42.

Wiring 40 may extend within or along one or more members of the framework 12. By way of non-limiting example, the wiring 40 may extend within and/or along one or both of the first and second members 12A, 12B. The wiring 40 may be covered, such as by one or more items of cladding by way of non-limiting example. The wiring 40 may alternatively, or additionally, be covered by tape, protective sheathing, conduit, combinations thereof, or the like. Alternatively, or additionally, the wiring 40 may be secured to one or more members of the framework 12 by tape, adhesive, cable ties, combinations thereof, or the like.

Alternatively, or additionally, the framework 12 may comprise one or more hollow members (e.g., first and second members 12A, 12B) to accommodate the wiring 40 traveling, at least in part, therethrough. Such hollow members may comprise steel tubing, by way of non-limiting example, and/or may comprise one or more apertures for the wiring 40 to enter and/or exit the members.

The wiring 40 may comprise power cables, data cables, combinations thereof, or the like. Any type, kind, and/or number of wires 40 may be utilized.

Figure 3A:
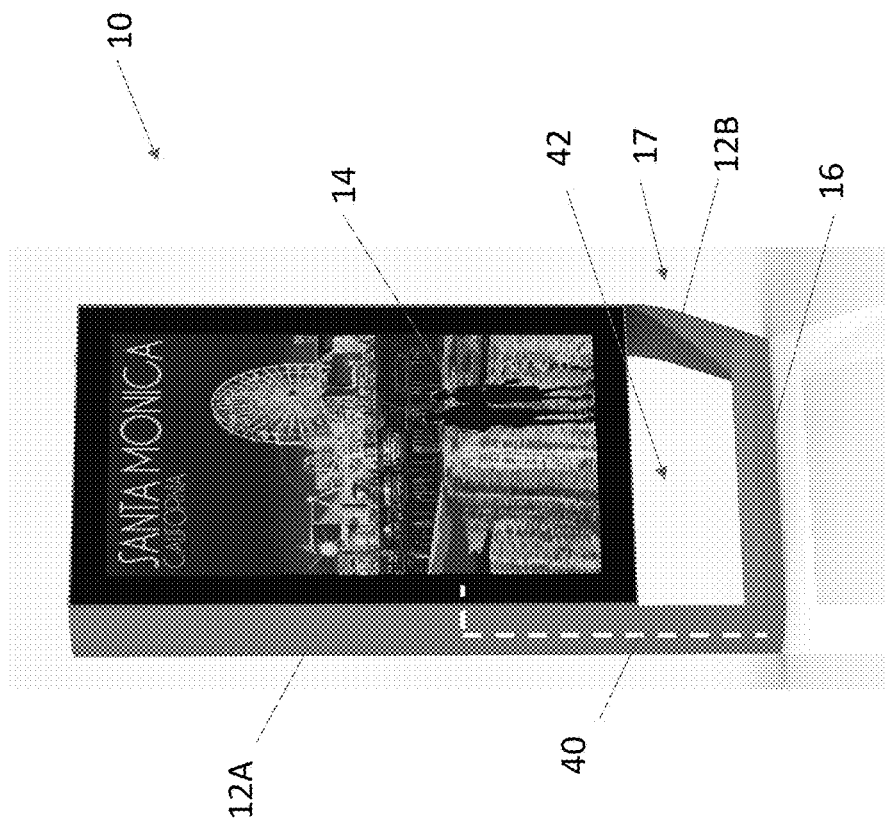
FIG. 3A is a perspective view of another exemplary display assembly with an unobstructed zone.
Figure 4:
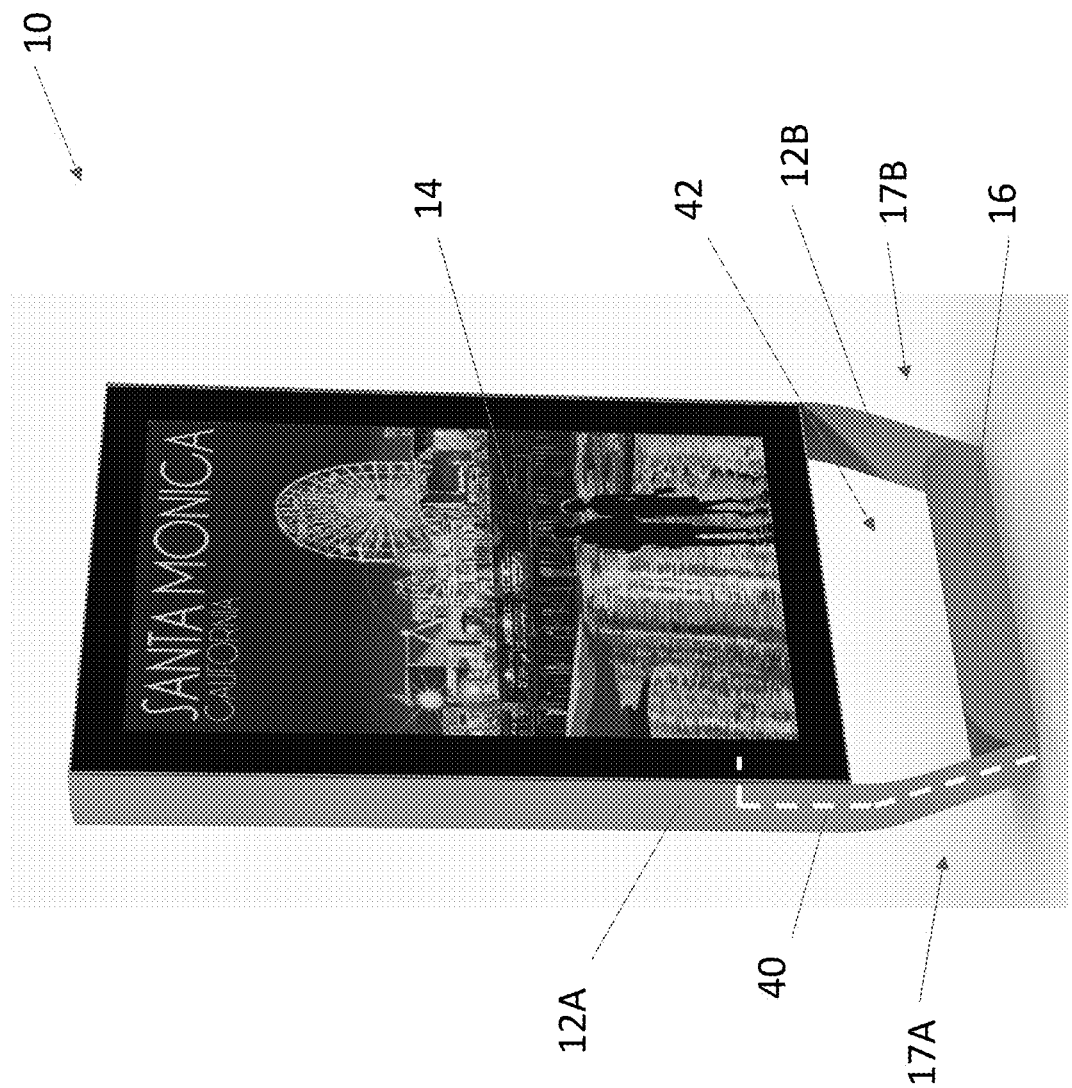
FIG. 4 is a perspective view of another exemplary display assembly with an unobstructed zone.

FIG. 3A through FIG. 4 illustrate additional exemplary embodiments of the assemblies 10 whereby one or more members of the framework 12 may comprise angled sections 17. For example, without limitation, one or both of the first and second members 12A, 12B may extend at a non-vertical angle (e.g., 45 degrees relative to horizontal), thereby reducing footprint of the base 16. In exemplary embodiments, without limitation, such angled sections 17 may be located between lower surfaces of the side assemblies 14 and the base 16. The units 10 may comprise a single angled section 17, or multiple angled sections 17A-17B. For example, without limitation, only one of the first and second members 12A, 12B may comprise the angled section 17, or both of the first and second members 12A, 12B may comprise one of the angled sections 17A, 17B.

Figure 5:
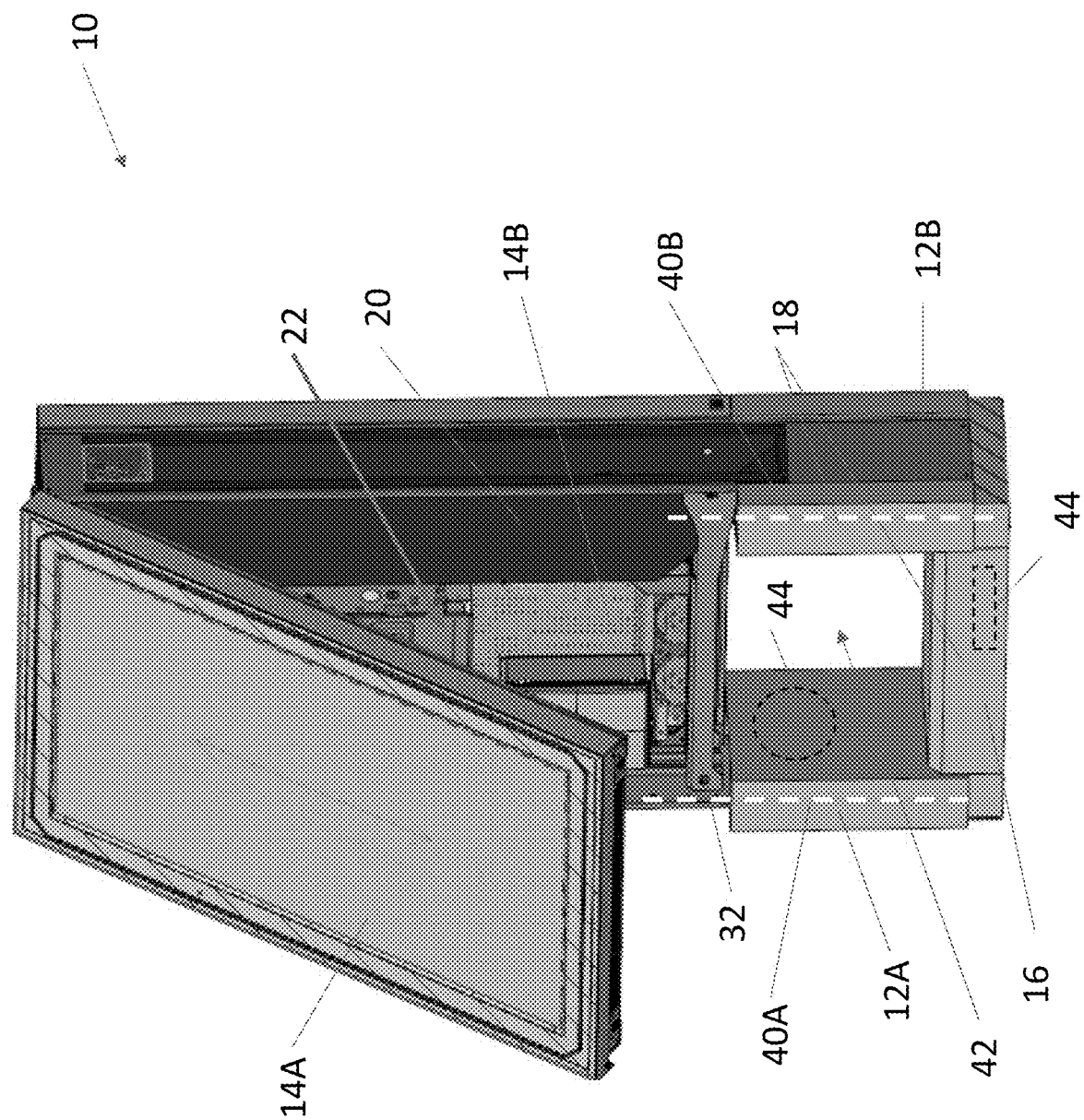
FIG. 5 is a perspective view of another exemplary display assembly with an unobstructed zone with one of the side assemblies in an opened position.
Figure 6B:
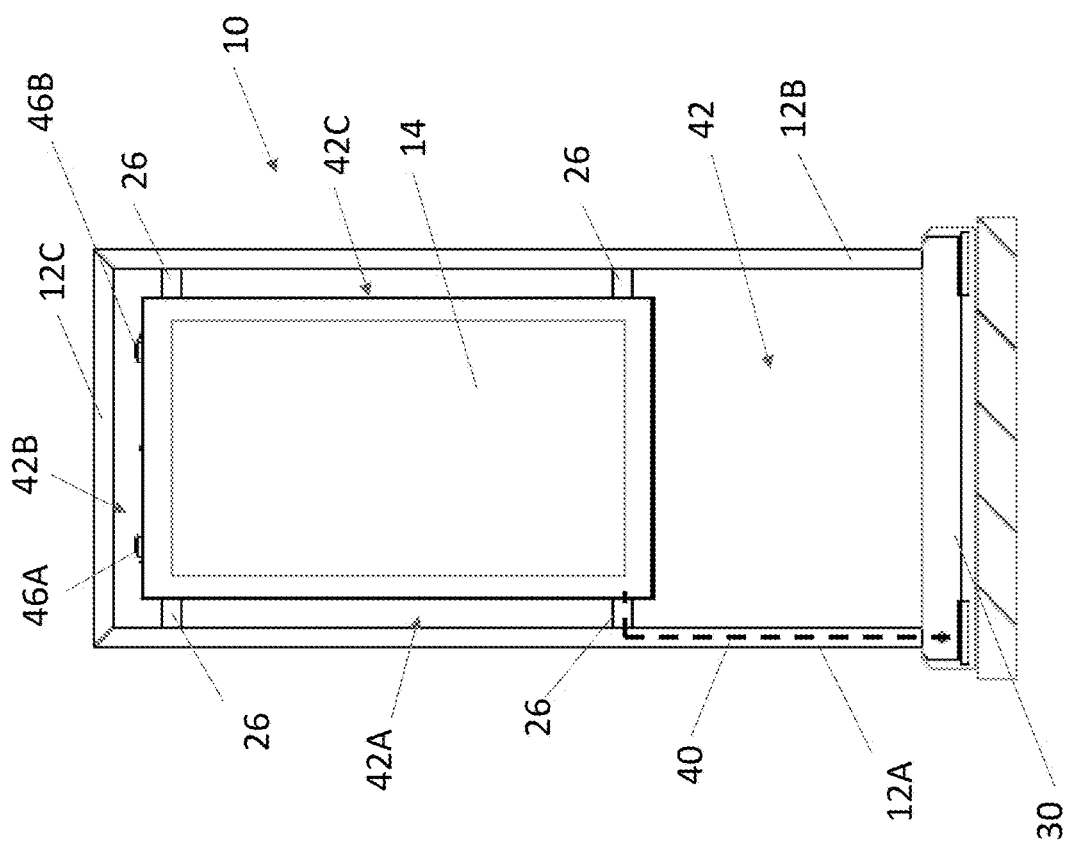
FIG. 6B is a front view of the unit of FIG. 6A.
Figure 6A:
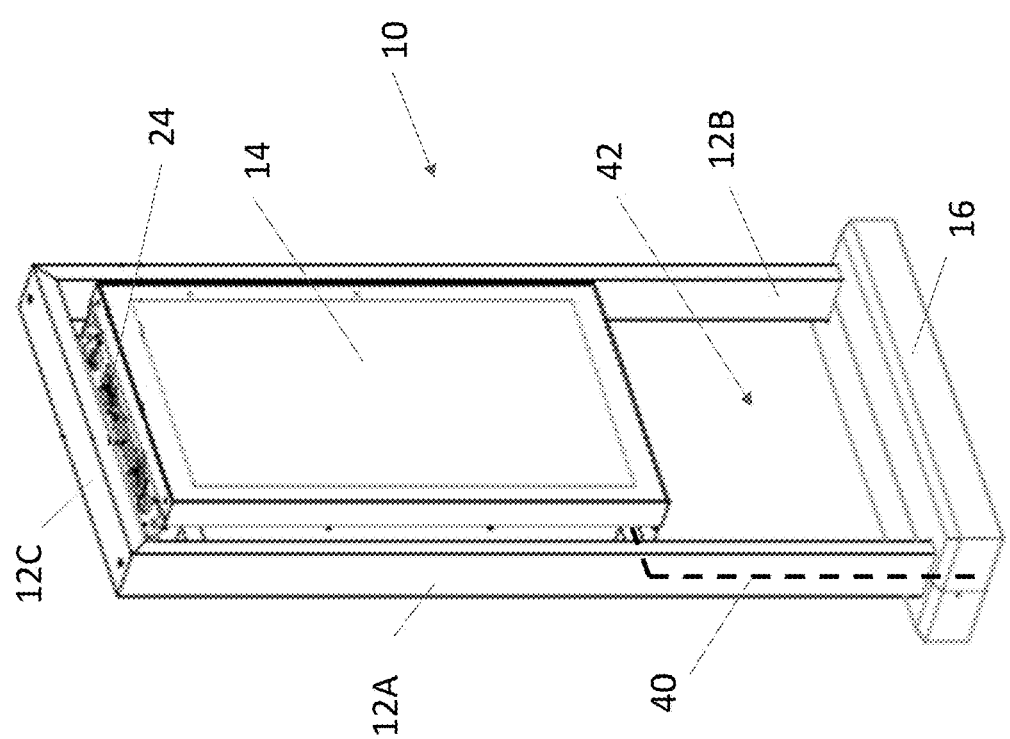
FIG. 6A is a perspective view of another exemplary display assembly with an unobstructed zone.
Figure 6C:
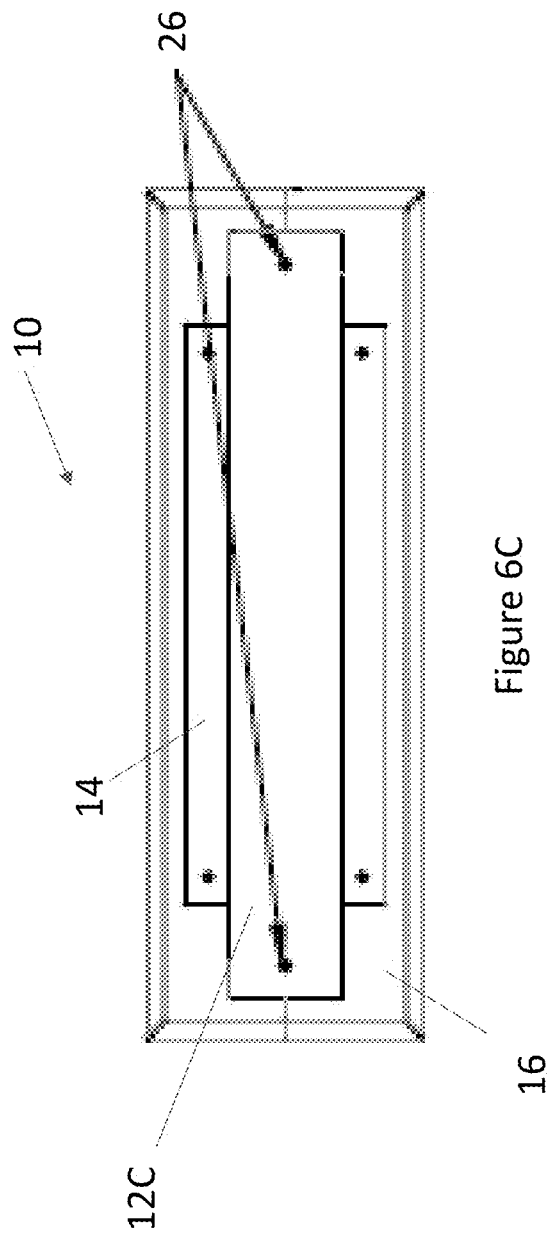
FIG. 6C is a top view of the unit of FIG. 6A.
Figure 6D:
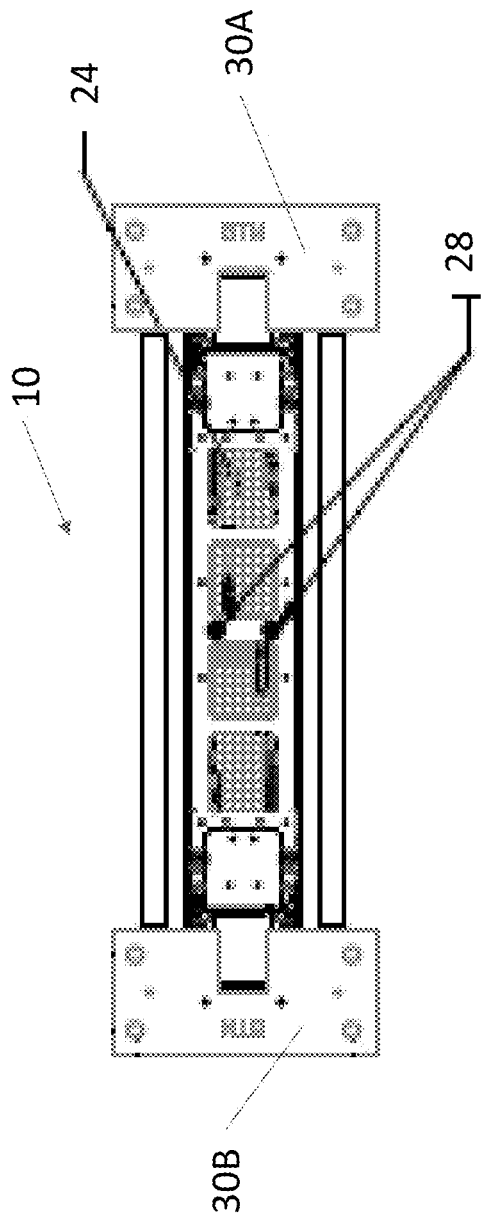
FIG. 6D is a bottom view of the unit of FIG. 6A.
Figure 6F:
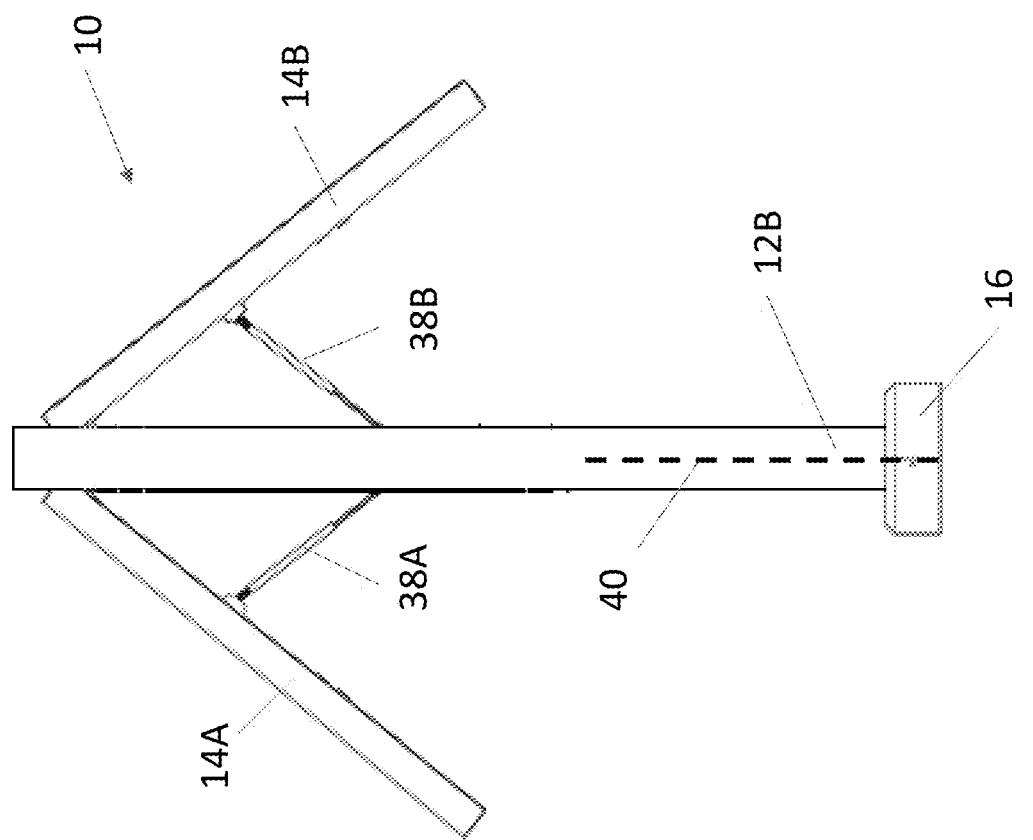
FIG. 6F is a left view of the unit of FIG. 6A with the side assemblies in opened positions.
Figure 6E:
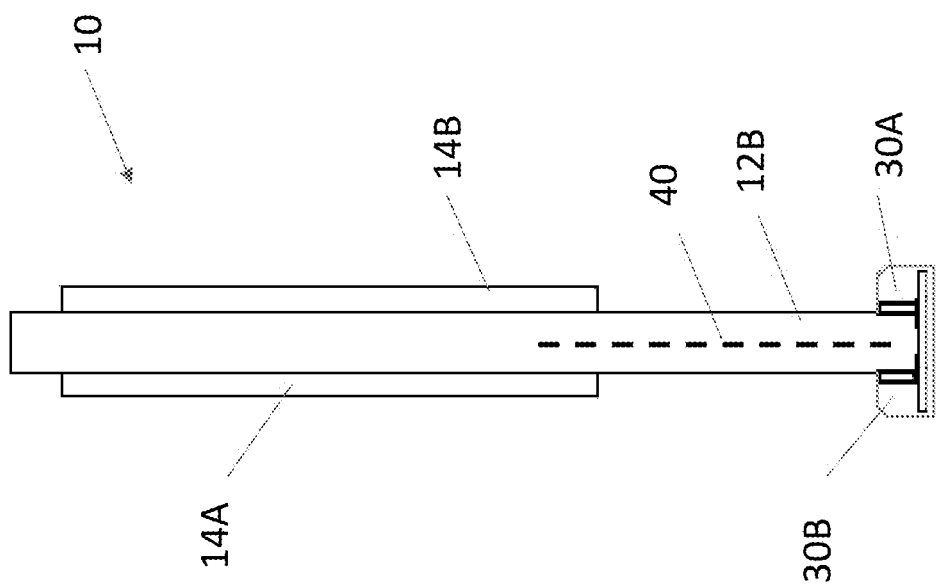
FIG. 6E is a left side view of the unit of FIG. 6A.

FIG. 5 illustrates another exemplary embodiment of the assembly 10. Certain electronic components 44 may be provided at or along one or more of the members of the framework 12. For example, without limitation, the electronic components 44 may be mounted to one or both of the first and second members 12A, 12B and/or the base 16. Such components 44 may be covered with one or more cladding panels 18. The cladding panels 18 may be attachable to the framework 12 by snap fit, fasteners, combinations thereof, or the like. Alternatively, or additionally, one or more members of the framework 12 may be fully or partially hollow to accommodate the electronic components 44.

Such electronic components 44 may comprise, for example, without limitation, power modules, media players, processors, electronic storage devices, electrical circuitry, bulk energy storage devices, sensors, electric vehicle (EV) charging equipment, network connectivity devices, combinations thereof, or the like. The assemblies 10 may comprise any type or kind of the electronic components 44 at any location or locations. For example, without limitation, the electronic components 44 may alternatively, or additionally, include cameras, air quality sensors, touch screens, telephones, audio and/or videoconferencing equipment, emergency signaling components, personal electronic changing adapters, ambient weather sensors, combinations thereof, or the like. At least some of the electronic components 44 may be provided within one or more compartments, such as but not limited to, junction boxes, fully or partially sealed boxes, or the like, such as within the cladding 18.

The side assemblies 14 may be configured for movement between a closed position, such as where the side assembly 14 extends generally vertical and proximate to the framework 12, and an opened position, such as where a bottom portion of the side assembly 14 is rotated outward and away from the framework 12. The side assemblies 14 may be configured for rotation to approximately 38.5 degrees, by way of non-limiting example. Any amount or angle of rotation may be utilized, such as between 0 degrees and 90 degrees.

The same or different ones of the electronic components 44 may be mounted to rear surfaces of the side assemblies 14 and/or within an interior compartment 22 extending between the side assemblies 14. The interior compartment 22 may comprise ambient air (filtered or otherwise) and/or circulating gas.

One or more recessed compartments 20 may be provided, such as to provide space for customer facing portions of certain electronic equipment 44, such as, but not limited to, EV charging equipment (e.g., handles, adapters). The EV charging equipment may be configured to provide any type or level of charging, such as but not limited to a level 1, 2, 3, or the like charger.

As illustrated with particular regard to FIG. 6A through FIG. 6F, the framework 12 may comprise one or more support members 26. The support members 26 may extend inward from other members of the framework 12, such as to support the side assemblies 14 within the framework 12. In this fashion, one or more additional unobstructed areas 42A, 42B, 42C may be provided along other sides of the side assemblies 14 (e.g., left, right, and top). Any number and arrangement of the support members 26 may be provided. The support members 26 may extend to some or all side edges of the side assemblies 14.

The wiring 40 may extend along and/or through one or more of the support members 26 to the side assemblies 14. The support members 26 may be hollow, by way of non-limiting example, though such is not required. Alternatively, or additionally, the wiring 40 may extend beneath tape, within sheathing or conduit, to name some non-limiting examples. Alternatively, or additionally, the wiring 40 may be secured to one or more of the support members 26 by tape, adhesive, cable ties, combinations thereof, or the like.

Opening 24, such as for ingestion and/or exhaustion of air from the units 10 (sometimes also referred to as intakes/exhausts), may be provided along one or more edges of the side assemblies 14, such as along an upper and lower edge thereof. The unobstructed zone 42 and/or at least one of the additional unobstructed zones 42B may be provided adjacent to such intakes/exhausts 2 in exemplary embodiments, without limitation, such as to provide clearance between the framework 12 and the side assemblies 14 to facilitate ingestion and/or exhaustion of air to/from the intakes/exhausts 24. One or more antennae 46A, 46B may be provided along one or more edges of the side assemblies 14, such as along an upper edge thereof. The unobstructed zone 42 and/or at least one of the additional unobstructed zones 42B may be provided adjacent to such antennae 46, in exemplary embodiments, without limitation, such as to provide clearance between the framework 12 and the side assemblies 14 to facilitate radio transmission to/from the antennae 46.

The assemblies 10 may comprise one or more mounting points 26. The mounting points 26 may comprise eyehooks, threaded holes, combinations thereof, or the like. Any number and/or arrangement of such mounting points 26 may be provided.

The assemblies 10 may comprise one or more locks 28. The locks 28 may be configured to selectively secure the side assemblies 14 in the closed positions, such as to prevent casual access, tampering, vandalism, or the like.

Movement assistance devices 38A, 38B, such as, but not limited to, gas struts, may extend between the framework 12 and the side assemblies 14, such as for assistance with moving or securing the side assemblies 14 in the opened and/or closed positions. Alternatively, or additionally, members for propping or otherwise securing the side assemblies 14 in the opened position may be provided. In exemplary embodiments, without limitation, each of the side assemblies 14 is movably connected to an upper portion of the framework 14, such as in a hinging manner by way of one or more hinges, to facilitate movement of the side assemblies 14, such as between an opened and/or closed position.

As illustrated with particular regard to at least FIGS. 5D-5E, the base 16 may comprise one or more stability elements 30A, 30B. The stability elements 30 may comprise members extending laterally, for example. This may provide space between such elements 30 for extending the wiring 40, mounting equipment (e.g., fasteners, nuts, washers, spacers, rubber grommets, combinations thereof, or the like), and/or placing electronic components 44 within the base 16. The base 16 may comprise one or more covers, cladding, or other panels, such as for securing over some or all of the stability elements 30 to disguise the same, along with the wiring 40, mounting equipment, and/or components 44.

FIG. 7A through FIG. 7C illustrate another exemplary embodiment of the display assembly 10. Customer facing portions of the EV charging equipment, such as but not limited to charge handles 52, cables 54, and/or cable management devices 56 may be provided at, such as within, the recessed compartment 20. The cable management devices 56 may include, by way of example without limitation, cable retraction devices (e.g., cable reels, spirators), cable organizers (e.g., hooks, posts, slots), combinations thereof, or the like. The cable reels may be configured to provide constant tension, may be actuated to cable 54 retraction (e.g., by way of one or more springs), may be manually operated, may be motorized, may be electronically actuated, combinations thereof, or the like. The cable management device(s) 56 may be provided at an upper portion of the recessed compartment 20, such as to elevate the cables 54 from a ground surface, such as within the recessed compartment 20 above the charge handles 52. The charge handles 52 may be provided, by way of non-limiting example, at an ergonomic or other height (e.g., in compliance with Americans with Disabilities Act (ADA) and/or various rules, laws, and/or regulations).

In exemplary embodiments, without limitation, some or all portions of the cable management devices 56 may be provided interior to the recessed compartment 20, such as behind and/or between a first and second one of the side assemblies 14A, 14B and/or within the framework 12. For example, without limitation, some or all portions of the cables 54 may be retractable towards and/or interior to framework 12, such as by way of one or more cable retraction devices. Alternatively, or additionally, some or all portions of the cables 54 may be organized at the framework 12, such as at or within the recessed compartment 20 by way of one or more cable organizers. One or more apertures may be provided in the framework 12 to facilitate retraction and extension of the cable(s) 54 interior to the framework 12, though such is not required. Any number of side assemblies 14 may be provided at the framework 12 in any arrangement.

The cable management device(s) 56 may be configured to retract and/or extend the cable(s) 54 automatically and/or by manually or other actuation. For example, without limitation, a user 58 may pull on the cables 54, actuate the cable reel(s), remove portions of the cables 54 from the cable organizers, combinations thereof or the like. As another example, without limitation, retraction of the cables 54 may be automatic, such as by way of constant tension, detection of end of a charge session (e.g., by electrical activity monitoring at the charge handle 52 and/or charging equipment 58, proximity sensors, cameras, etc. detecting charge handle 52 position, user 58 activity, vehicle position, combinations thereof, or the like), combinations thereof, or the like.

Any type or kind of charge handles 52, cables 54, and/or cable management devices 56 may be utilized at any location. More than one recessed compartment 20 may be provided, such as at opposing sides of the display assembly 10, though such is not required. The unobstructed zone 42 may be defined, at least in part, by at least a portion of the recessed compartment 20, though such is not required.

In exemplary embodiments, without limitation, additional EV charging equipment items 58 may be located interior to the framework 12, such as behind and/or between the side assemblies 14. The additional EV charging equipment 58 may comprise and/or be configured to provide 50 kVA. In this fashion, the additional EV charging equipment 58 may be integrated with the display assembly 10. The additional EV charging equipment 58 may comprise power supplies, transformers, capacitors, current limiters, voltage limiters, circuit breakers, controllers, power meters, combinations thereof, or the like. Some or all of the additional EV charging equipment 58 may be shared for the side assemblies 14, though such is not necessarily required.

One or more payment components 60 may be provided at the display assembly 10. Some or all of the one or more payment components 60 may be provided at the recessed compartment(s) 20, though any location may be utilized. The payment components 60 may comprise, for example without limitation, one or more payment card (e.g., credit card, debit card, gift card) readers (e.g., key pads, touch screens, magnetic tape, chip readers, near field communication devices, combinations thereof, or the like), automated cash handling devices (e.g., coin receptacles, bill receptacles), combinations thereof, or the like. Some or all of the payment components 60, such as but not limited to customer facing portions thereof, may be provided at an exterior of the display assembly 10. For example, without limitation, at the framework 12, the recessed compartment 20, one or more of the side assemblies 14, combinations thereof, or the like. The payment components 60 may be provided, by way of non-limiting example, at an ergonomic or other height (e.g., in compliance with ADA and/or other various rules, laws, and/or regulations).

Users 58A, 58B may be able to see through the unobstructed zone 42. This may permit a user 58A to see another user 58B, other person, and/or object (e.g., car or other vehicle) approaching, by way of non-limiting example. This may assist with compliance to various rules, laws, and/or regulations.

An angular member 12B may be provided at a side of the display assembly 10 opposite the recessed compartment 20, though such is not required.

Figure 8:
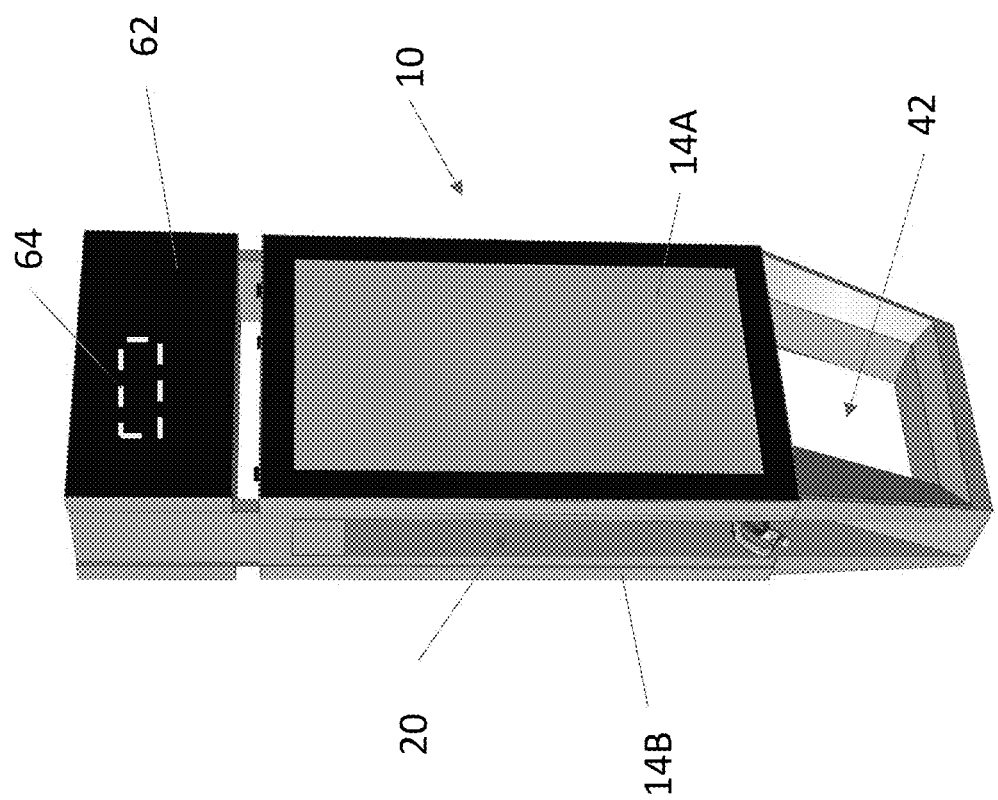
FIG. 8 is a perspective view of another exemplary embodiment of the display assembly with an unobstructed zone and exemplary communications cabinet.

FIG. 8 illustrates another exemplary embodiment of the display unit 10 with an exemplary communications cabinet 62. The communications cabinet 62 may be provided above the side assemblies 14. The communications cabinet 62 may be spaced apart from the side assemblies 14 and/or the framework 12, though such is not required. Portions of the framework 12 may form part of the communications cabinet 62, though such is not required. The unit 10 may include EV charging equipment, a recessed compartment, combinations thereof, or the like, though such is not required.

The communications cabinet 62 may comprise one or more radio frequency transparent or translucent materials, such as but not limited to glass, fabric, and/or plastic. For example, without limitation, one or more panels of the communications cabinet 62 may comprise and/or be formed from such materials.

The communications cabinet 62 may enclose one or more communications equipment items 64. The communications equipment items 64 may comprise, for example without limitation, one or more wireless connectivity devices, radio antennae, internet routers, modems, cellular network connectivity devices, near field communications devices, combinations thereof, or the like. In this fashion, the display unit 10 may provide a public or private wi-fi "hotspot". The communications equipment items 64 may be configured to operate on and/or provide 5G wireless connectivity, though such is not necessarily required. Some or all of the communications equipment items 64 may be provided such that bottom portions thereof are no less than 9.5 feet or 3 meters above a ground surface to which the display assembly 10 is mounted or configured for mounting, by way of non-limiting example.

The communications cabinet 62 may be in fluid communication with other portions of the unit 10, such as but not limited to the side assemblies 14 and/or space between the side assemblies 14, though such is not required. The communications cabinet 62 may comprise one or more apertures, airflow pathways, fans, heat exchangers, thermal management devices, combinations thereof, or the like for removing heat generated by equipment, such as but not limited to the communications equipment items 64, located within the communications cabinet 62. Airflow, such as between the communications cabinet 62 and/or the side assemblies 14 and/or space between the side assemblies 14, may be as shown and/or described in at least WO 2020/028045 filed internationally on Jul. 17, 2019, the disclosures of which are hereby incorporated by reference as if fully restated herein, by way of non-limiting example. Alternatively, or additionally, airflow may be provided through one or more panels or other surfaces of the communications cabinet 62, which may comprise one or more apertures, such as by way of passive and/or active cooling. One or more of the panels may comprise fabric, by way of non-limiting example.

The communications cabinet 62 and/or the communications equipment items 64 may share power and/or data connectivity, and/or components thereof, with other items of the display assembly 10, such as but not limited to the side assemblies 14 and/or EV charging equipment.

The communications cabinet 62 may be located directly above the side assemblies 14 or spaced apart from the side assemblies 14.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. The electronic devices, including but not necessarily limited to the electronic storage devices, databases, or the like, may comprise and/or be configured to hold, solely non-transitory signals.

What is claimed is:

1. A display assembly comprising:
   a framework;
   an electronic display subassembly connected to said framework at an elevated position; and
   an open, unobstructed, pass-through area located below said electronic display subassembly and within said framework.

2. The display assembly of claim 1 further comprising:
   one or more electric vehicle (EV) chargers.

3. The display assembly of claim 2 wherein:
   each of said one or more EV chargers comprise a charge handle, a receptacle located at a side of said framework and configured to receive said charge handle, additional equipment located interior to said framework, and a cable extending between said additional equipment and said charge handle; and
   said cable extends, at least in part, exterior to said framework from said side of said framework.

4. The display assembly of claim 3 further comprising:
   one or more cable management devices for said cable.

5. The display assembly of claim 4 wherein:
   said one or more cable management devices comprise at least one cable reel located at said side of said framework.

6. The display assembly of claim 3 further comprising:
   at least one payment component located exterior to said framework at said side of said framework.

7. The display assembly of claim 6 wherein:
   said at least one payment component comprises a wireless payment card reader.

8. The display assembly of claim 1 wherein:
   the framework comprises:
      first and second upward extending members spaced apart from one another; and
      a base extending laterally between said first and second upward extending members; and
   the open, unobstructed, pass-through area is defined, at least in part, by the base, the first upward extending member, and the second upward extending member.

9. The display assembly of claim 8 wherein:
   at least one of said first upward extending member and said second upward extending member comprises a non-vertical, non-horizontal, angled section located below a lower surface of said electronic display subassembly.

10. The display assembly of claim 9 wherein:
    both of said first upward extending member and said second upward extending member comprises the non-vertical, non-horizontal, angled section located below the lower surface of said electronic display subassembly.

11. The display assembly of claim 8 further comprising:
    electronic equipment for operating said display assembly located at or within the base; and
    wiring extending along or within at least a portion of said framework from said electronic equipment to said electronic display subassembly.

12. The display assembly of claim 11 further comprising:
    support members, each extending from an interior surface of said framework to said electronic display assembly, wherein at least a portion of said wiring extends along or through at least one of the support members.

13. The display assembly of claim 11 wherein:
    said electronic equipment comprises at least one power module.

14. The display assembly of claim 8 further comprising:
    a communications cabinet located above said electronic display subassembly;
    wireless communications equipment located within said communications cabinet; and
    wiring extending along or within at least a portion of said framework to said electronic display subassembly and said wireless communications equipment.

15. The display assembly of claim 1 further comprising:
    a second electronic display subassembly connected to a second side of said framework at the elevated position, wherein said electronic display subassembly is connected to a first side of said framework.

16. The display assembly of claim 15 wherein:
    said electronic display subassembly and said second electronic display subassembly are each configured for movement relative to said framework between a closed position where said electronic display subassembly and said second electronic display subassembly are, respectively, located against or adjacent to said framework and an open position where at least a portion of said electronic display subassembly and said second electronic display subassembly are, respectively, moved away from said framework.

17. The display assembly of claim 1 wherein:
said electronic display subassembly comprises a backlight and a liquid crystal layer.

18. The display assembly of claim 1 further comprising:
one or more airflow pathways, at least one of which extends within or adjacent to the electronic display subassembly; and
one or more fans located along the at least one of the one or more airflow pathways.

19. A display assembly comprising:
a structural framework comprising a base and at least two upward extending members;
an electronic display subassembly connected said structural framework at an elevated position; and
an open, unobstructed, pass through area defined, at least in part, by a lower surface of said electronic display subassembly, an upper surface of said base, and an interior facing surface of each of said at least two upward extending members.

20. A display assembly comprising:
a structural framework comprising a series of interconnected members forming a larger framework; and
an electronic display subassembly positioned within said larger framework, wherein a lower surface of said electronic display subassembly and an interior facing surface of at least some of said series of interconnected members of said structural framework define an open, unobstructed, pass-through area within the larger framework.

* * * * *

UNITED STATES PATENT AND TRADEMARK OFFICE
CERTIFICATE OF CORRECTION

| | | |
|---|---|---|
| PATENT NO. | : 12,250,781 B2 | Page 1 of 1 |
| APPLICATION NO. | : 18/643091 | |
| DATED | : March 11, 2025 | |
| INVENTOR(S) | : Dunn et al. | |

It is certified that error appears in the above-identified patent and that said Letters Patent is hereby corrected as shown below:

On the Title Page

In Item (56), References Cited, Other Publications, please delete "I-Tech Company, 65 Outdoor Digital Signage Sunlight All Weather Proof LCD, 1 Page." and insert -- I-TECH COMPANY, 65" Outdoor Digital Signage Sunlight All Weather Proof LCD, 1 Page --.

In Item (56), References Cited, Other Publications, please delete "SUNLIGHTLCD.COM, 46 All Weather NEMA4 Outdoor High Brightness (Model: GS4600L), Mar. 11, 2009, 2 Pages." and insert -- SUNLIGHTLCD.COM, 46" All Weather NEMA4 Outdoor High Brightness (Model: GS4600L), 03/11/2009, 2 Pages --.

Signed and Sealed this
Fifteenth Day of April, 2025

Coke Morgan Stewart
*Acting Director of the United States Patent and Trademark Office*